United States Patent [19]

Nagano et al.

[11] Patent Number: 4,557,994

[45] Date of Patent: Dec. 10, 1985

[54] LIGHT-SENSITIVE PRINTING PLATE WITH PATTERNED MATTING LAYER

[75] Inventors: Teruo Nagano, Kanagawa; Eiji Nakakita; Toshiyuki Sekiya, both of Shizuoka, all of Japan

[73] Assignee: Fuji Photo Film Co., Ltd., Kanagawa, Japan

[21] Appl. No.: 649,964

[22] Filed: Sep. 13, 1984

Related U.S. Application Data

[63] Continuation of Ser. No. 484,817, Apr. 14, 1984, abandoned.

[30] Foreign Application Priority Data

Apr. 20, 1982 [JP] Japan ................... 57-66966

[51] Int. Cl.$^4$ ................................. G03C 1/52
[52] U.S. Cl. ...................... 430/162; 430/155; 430/166; 430/523; 430/537; 430/950; 430/961
[58] Field of Search .......... 430/950, 529, 162, 166, 430/155, 961, 523, 537

[56] References Cited

U.S. PATENT DOCUMENTS

| | | | |
|---|---|---|---|
| 3,857,729 | 12/1974 | Burwasser | 430/950 |
| 4,142,894 | 3/1979 | Hori et al. | 430/950 |
| 4,147,550 | 4/1979 | Campbell et al. | 430/529 |
| 4,225,665 | 9/1980 | Schadt, III | 430/529 |
| 4,232,117 | 11/1980 | Naoi et al. | 430/950 |
| 4,264,719 | 4/1981 | Kamoeka et al. | 430/950 |
| 4,287,299 | 9/1981 | Himmelmann et al. | 430/950 |
| 4,288,526 | 6/1985 | Oda et al. | 430/272 |
| 4,301,240 | 11/1981 | Bruck et al. | 430/950 |
| 4,343,873 | 8/1982 | Sasaoka | 430/950 |
| 4,388,402 | 6/1983 | Mukunoki et al. | 430/529 |

FOREIGN PATENT DOCUMENTS 2081919 2/1982 United Kingdom .

*Primary Examiner*—Jack P. Brammer
*Attorney, Agent, or Firm*—Sughrue, Mion, Zinn, Macpeak & Seas

[57] ABSTRACT

A light-sensitive printing plate is disclosed. The printing plate is comprised of a support base having a light-sensitive layer positioned thereon and a matting layer comprised of a micropattern of protuberances. The protuberances are present in a regular or randomly mixed manner on the light-sensitive layer and are comprised of a copolymer. The copolymer includes a monomer (unit a) with a sulfonic acid group, a monomer (unit b) selected from the group consisting of alkyl acrylates having 1 to 10 carbon atoms in the alkyl moiety thereof and alkyl methacrylates having 4 to 10 carbon atoms in the alkyl moiety thereof and a monomer (unit c) copolymerizable with monomer (unit a) and monomer (unit b), monomer (unit c) as a copolymer having a glass transition point of 60° C. or above. The matting layer does not cause staining of a film original when superposed thereon and is resistant to rubbing or pressure and provides a surface which can be vacuum contacted with a film in a short period of time.

8 Claims, No Drawings

4,557,994

LIGHT-SENSITIVE PRINTING PLATE WITH PATTERNED MATTING LAYER

This is a continuation of application Ser. No. 484,817 filed Apr. 14, 1984.

FIELD OF THE INVENTION

The present invention relates to a light-sensitive printing plate. More particularly, it relates to a composition of a matting layer comprising a micropattern of coated portions and non-coated portions present in a regular manner or a randomly mixed manner on a light-sensitive printing plate.

BACKGROUND OF THE INVENTION

In forming images on light-sensitive printing plates, a film original is usually superposed on a light-sensitive printing plate, then exposure of the printing plate is conducted through the film original. In this situation, the light-sensitive layer of the light-sensitive printing plate and the superposed film original must be brought into completely intimate contact with each other to thereby avoid forming a vaguely exposed image due to possible gaps therebetween for the purpose of producing a distinct image. Therefore, in general, a light-sensitive printing plate and a film original are disposed one over the other between a glass plate and a rubber sheet of a vacuum printing frame, and are brought into an intimate contact with each other by evacuating the space between the glass and the rubber sheet (vacuum-contacting method). However, with smooth-surfaced light-sensitive printing plates, evacuation of the space results in intimately contacting the smooth-surfaced printing plate with a film original only in the periphery thereof, which prevents the central area thereof from being evacuated. Thus, it requires quite a long time to intimately contact the film original with the whole surface of the light-sensitive printing plate, which reduces the efficiency of the plate-making procedure and makes the procedure economically disadvantageous.

In order to shorten the vacuum-contacting time, a light-sensitive printing plate having on its surface a matting layer comprising a micropattern of coated portions and non-coated portions present in a regular or randomly mixed manner and a process for its preparation have been developed as described in U.S. Pat. Nos. 4,216,289, 4,251,620 and 4,288,526. This technique forms a matting layer by coating, in a micropattern, a solution or dispersion of a matting material (a single substance or a composition) which does not exert detrimental physical or chemical influences on the light-sensitive layer of a light-sensitive printing plate and which can be easily removed upon development processing of the printing plate, to thereby form a micropattern of the material. In this case, the coating solvent to be used is desirably water or an aqueous liquid and not an organic solvent from the point of safety upon production of the printing plate.

However, the use of water or an aqueous liquid, which means to use a water-soluble resin as a major component of the composition, has involved the problem that, under highly humid conditions the matting layer can stain the film original, or the adhesion force of the matting layer to the light-sensitive layer may be too weak to resist against rubbing or pressure. Therefore, the matting layer tends to partly remain on the developed image portion which destroys the affinity of the image portion for ink. Accordingly, as is described in UK Patent Application GB 2081919A, a procedure has been developed which involves coating an aqueous solution or dispersion of a resin containing a specific monomer unit. However, this technique has been found to cause problems with developability or printing properties of the light-sensitive layer due to the use of a resin composition containing a resin which utilizes carboxyl groups as water-solubilizing group. More specifically, in order to make a copolymer containing a monomer unit having a weakly acidic group like a carboxyl group water-soluble, the introduction of about 80 wt% or more carboxyl group is necessary. However, such a copolymer has only weak film-forming properties and is susceptible to moisture. On the other hand, conversion of the copolymer to an alkali metal salt, ammonium salt or water-soluble amine salt serves to reduce the amount of carboxyl group. However, it makes the coated portions alkaline and, when a diazonium salt is used as a light-sensitive substance, the diazonium salt in a light-sensitive layer is decomposed with time. Accordingly, the denatured portion becomes difficult to develop.

SUMMARY OF THE INVENTION

The present invention solves the above-described problems with the prior art, and its object is to provide a light-sensitive printing plate having on its surface a matting layer comprising a pattern of coated portions and non-coated portions present in a regular or randomly mixed manner, said coated portions not staining a film original superposed thereon, being resistant against rubbing or pressure, and not inhibiting, after development, the affinity of developed line images for an ink. This light-sensitive printing plate has a matting layer which contains a copolymer containing at least one monomer unit having a sulfonic acid group.

DETAILED DESCRIPTION OF THE INVENTION

The light-sensitive printing plate in accordance with the present invention fundamentally comprises a support having provided thereon a light-sensitive layer, on which a film original is to be superposed for exposure in an imagewise exposing step of a photographic plate-making process, as has been described at the beginning. The support of the light-sensitive printing plate desirably undergoes no dimensional extension and contraction and has a stable and hydrophilic surface.

The support is desirably in a sheet-like or plate-like form for purposes of handling convenience and according to common practice in the art of printing plates and, in special cases, it may be in a band form. Materials for such support include paper; paper coated or laminated with a hot-melt plastic such as polyethylene, polypropylene or polystyrene; plates of metals such as aluminum, various aluminum alloys, zinc, iron or copper; plastic films of, for example, cellulose diacetate, cellulose butyrate, cellulose acetate butyrate, cellulose propionate, cellulose triacetate, cellulose nitrate, polyethylene terephthalate, polypropylene, polycarbonate or polyvinyl acetal; paper or plastic films laminated or vacuum deposited with the metals described above.

The above-described support is treated, if necessary, to render its surface hydrophilic. This hydrophilicity-imparting treatment is conducted by chemically and/or physically and/or electrochemically treating the support surface itself or by providing a hydrophilic undercoating layer on the surface of the support. For example, with a support having a metal surface, chemical etching with acid or alkali, brushing with a slurry of fine powder like pumice, or electrochemical etching or anodic oxidation is conducted. With a support having a plastic surface, a hydrophilic undercoating layer is generally provided thereon. Various formulations are known for this undercoating layer. With a support having a cellulose type plastic surface, the surface per se can be converted to a hydrophilic layer by subjecting it to hydrolysis treatment. These techniques with respect to the support are known to the art as described in, for example, U.S. Pat. No. 4,288,526 and can be properly selected for the practice of the present invention. On the support is provided a light-sensitive layer selected depending upon the end-use of the light-sensitive printing plate to be produced.

The light-sensitive layer of the light-sensitive printing plate may include many light-sensitive layers such as a silver halide-gelatin emulsion light-sensitive layer, a diazo resin light-sensitive layer, a light-sensitive resin layer, etc. In some cases, they may be used in a combination of two or more. When the silver halide-gelatin emulsion, for example, is used as the light-sensitive layer of the light-sensitive printing plate, a silver chlorobromide emulsion or silver chlorobromoiodide emulsion each containing silver chloride, silver chlorobromide, silver chlorobromoiodide, etc., particularly containing at least 50 mole% of silver chloride, is preferred.

A typical diazo light-sensitive material is a condensate between p-diazodiphenylamine and paraformaldehyde or acetoaldehyde. In addition, it is possible to use a composition comprising an o-quinonediazide compound, a composition comprising a light-sensitive azide compound, a composition comprising a high molecular compound containing —CH=CHCO— group in the main or side chain thereof, a photopolymerizable composition comprising an addition polymerizable unsaturated compound, and a light-sensitive composition comprising a light-sensitive substance such as a glue light-sensitive solution, a shellac light-sensitive solution or a dichromate light-sensitive solution and, if desired, a binder and additives for various purposes.

These light-sensitive compositions are made into coating solutions by adding thereto a proper amount of a solvent. The resulting coating solutions are coated in a uniform thickness on a support by properly using a coater, followed by drying the coated layer to form a light-sensitive layer having an almost smooth surface. The coating amount of the light-sensitive layer is preferably 0.1 to 5 g/m$^2$, most preferably 0.5 to 4 g/m$^2$. With every light-sensitive material, its synthesis, preparation of a coating solution, and procedure of coating, drying, cutting, etc., can be conducted utilizing conventionally known techniques to thereby produce a desired light-sensitive printing plate.

As has been described hereinbefore, the light-sensitive printing plate to be used in the present invention is that which can be exposed through a film original superposed thereon and has a smooth surface. Hence, known light-sensitive relief printing plates, light-sensitive resin relief printing plates, various light-sensitive printing plates, various light-sensitive deep-etched printing plates, light-sensitive flexographic printing plates, light-sensitive screen printing plates, and various silver halide emulsion type printing plates can be used in the present invention.

The present invention comprises providing, on the surface of the above-described light-sensitive printing plate, a matting layer comprising a micropattern composed of coated portions and non-coated portions present in a regular or randomly mixed manner. As to the techniques for providing such matting layer on the surface of the light-sensitive printing plate, many methods and forms have heretofore been known as described in, for example, UK Patent Application GB 2081919A.

The most characteristic aspect of the present invention is the ingredient of the matting layer. The matting layer of the present invention contains an ingredient containing a copolymer having at least one monomer unit having a sulfonic acid group. Specific examples of monomers (monomer a) constituting the monomer unit include p-styrenesulfonic acid, 2-acrylamido-2-methylpropanesulfonic acid, ethylenesulfonic acid, 2-chloroethylenesulfonic acid, ethylenedisulfonic acid, 1-propene-1-sulfonic acid, 1-propene-2-sulfonic acid, 2-methyl-1,3-propenedisulfonic acid, 1-butene-1-sulfonic acid, 1-pentene-1-sulfonic acid, 1-hexene-1-sulfonic acid, 2-phenylethylenesulfonic acid, 1-methyl-2-phenylethylenesulfonic acid, 3-chloroallylsulfonic acid, allylsulfonic acid, 3-chloro-2-butenesulfonic acid, 3-chloromethallylsulfonic acid, methallylsulfonic acid, 3-methyl-2-butene-2-sulfonic acid, 3-phenylallylsulfonic acid, 3-phenylmethallylsulfonic acid, 2-benzylallylsulfonic acid, 2-chloro-4-styrenesulfonic acid, vinyltoluenesulfonic acid, α-methylstyrenesulfonic acid, etc. One, two or more of these monomers are properly selected and copolymerized with at least one other monomer. Monomers particularly preferable for the present invention are p-styrenesulfonic acid, 2-acrylamido-2-methylpropanesulfonic acid, and ethylenesulfonic acid.

Examples of the "other monomer" (monomer b) to be copolymerized with these monomers having a sulfonic acid group include alkyl acrylates having 1 to 10 carbon atoms in the alkyl moiety thereof and alkyl methacrylates having 4 to 10 carbon atoms in the alkyl moiety thereof. Specific examples thereof include methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, n-butyl methacrylate, isobutyl methacrylate, n-amyl methacrylate, 2-ethylhexyl methacrylate, n-octyl methacrylate, and n-decyl methacrylate. These comonomers b are ingredients which impart to a resulting copolymer adhesive properties to the surface of the light-sensitive layer. Particularly preferred examples of the monomer unit b include methyl acrylate, ethyl acrylate, n-propyl acrylate, isopropyl acrylate, n-butyl acrylate, isobutyl acrylate, n-butyl methacrylate and isobutyl methacrylate. It is desirable to further copolymerize with another monomer (monomer c) which imparts to a resulting copolymer a pressure resistance. As monomer c, those which show, as homopolymer, a glass transition point (Tg) of 60° C. or above are desirable. If Tg is less than 60° C., the function desired for monomer c to impart pressure resistance to a resulting copolymer is not fully obtained. Additionally, as to the definition of Tg, see, for example, *Polymer Handbook* (compiled by J. Brandrup and E. H. Immergut and published by Interscience Publishers in 1966), chap. III, p. 61.

Monomer c includes styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene, p-cyanostyrene, acrylonitrile, methacrylonitrile, methyl methacrylate, ethyl methacrylate, acrylamide, N-sec-butylacrylamide, N-tert-butylacrylamide, N,N-dibutylacrylamide, N-tert-butylmethacrylamide, etc. Particularly preferred examples of the monomer unit c include styrene, acrylonitrile, methacrylonitrile, methyl methacrylate, ethyl methacrylate and N-tert-butyl methacrylamide.

In the copolymer, the amounts of monomer (unit) a, monomer (unit) b, and monomer (unit) c are desirably lying in the range of from 5 to 50 mole%, 10 to 70 mole%, and 20 to 80 mole%, respectively. As the amount of monomer (unit) a decreases below 5 mole%, solubility of a resulting copolymer in a developer becomes poor, whereas as the amount increases above 50 mole%, the resulting copolymer becomes susceptible to moisture and its adhesion force to the surface of a light-sensitive layer is reduced. As the amount of monomer (unit) b decreases below 10 mole%, adhesion force of the resulting copolymer to a light-sensitive layer is reduced, whereas as the amount increases above 70 mole%, the resulting copolymer shows a reduced pressure resistance. Further, as the amount of monomer (unit) c decreases below 20 mole%, hardness and pressure resistance of the resulting copolymer are reduced, whereas as the amount increases above 80 mole%, the adhesion force of the resulting copolymer to a light-sensitive layer is reduced. Particularly preferable amounts of monomer units a, b and c are 8 to 25 mole%, 15 to 50 mole%, and 40 to 70 mole%, respectively. The copolymer has preferably the average molecular weight of 2,000 to 200,000, most preferably 10,000 to 100,000.

The copolymer to be used in the present invention can be synthesized according to processes conventionally known to the art. For example, a desired copolymer can be obtained by copolymerizing according to a solution polymerization process and, if desired, neutralizing acid residue of a produced copolymer. In this solution polymerization, copolymerization is usually conducted in a solvent capable of dissolving starting monomers such as i-propyl alcohol under a nitrogenous atmosphere in the presence of a polymerization initiator. Alternatively, similarly with synthesis of ordinary latex, starting monomers may be emulsified in water with the aid of a surfactant and emulsion-polymerized using a polymerization initiator such as potassium persulfate to obtain a copolymer as an aqueous dispersion or, of course, as a solid product. Those methods are described in, for example, U.S. Pat. Nos. 1,933,052, 2,117,321, 2,118,863, 2,144,233 and 3,057,812.

The copolymer as described above is used in the form of an aqueous solvent system as a coating solution. That is, it can be used in the form of an aqueous solvent system of any type; for example, an aqueous solution, an aqueous dispersion, an aqueous suspension, an aqueous emulsion, etc.

To this coating solution may be added, in addition to the above-described copolymer, proper additives for various purposes in proper amounts. For example, it is possible to add light-absorbing agents having an optical absorption in the wavelength range of actinic light for a light-sensitive layer of a light-sensitive printing plate as described in U.S. Pat. No. 4,126,460, dyes, pigments, UV ray absorbents, diazo compounds, ethylenically unsaturated compounds, etc.; various fine powders such as silicon dioxide, zinc oxide, titanium oxide, zirconium oxide, glass, alumina, synthetic resin, etc.; pH-adjusting agents such as phosphoric acid, phosphorous acid, oxalic acid, etc.; and neutral salts for accelerating precipitation of the copolymer after coating such as sodium sulfate, calcium sulfate, magnesium sulfate, sodium chloride, calcium chloride, etc. The concentration of the copolymer in the coating solution preferably falls within the range of from 5 to 50 wt%. The coating solution can be prepared according to conventional techniques, and no detailed descriptions seem to be necessary.

In coating the above-described aqueous coating solution on the surface of a light-sensitive printing plate to form a matting layer comprising a micropattern composed of coated portions and non-coated portions present in a regular or randomly mixed manner, the coating solution is coated by an air-spraying method, an airless spraying method, an electrostatic air-spraying method, an electrostatic atomizing, an electrostatic coating method, a gravure printing method, or the like, then dried. Those methods are described in detail in, for example, U.S. Pat. Nos. 4,216,289, 4,251,620 and 4,288,526.

In addition, the above-described matting layer can also be formed by preparing fine powder of the aforesaid copolymer or of a composition containing the copolymer and the above-described additives and uniformly spreading the powder on the surface of a light-sensitive printing plate as described in UK Patent Application No. GB 2025646A, thus, a micropattern composed of coated portions and non-coated portions present in a randomly mixed manner are formed. In preparing the fine powder of the above-described solid ingredients, solid obtained by solidifying an aqueous solution containing the copolymer prepared in a manner described hereinbefore may be utilized. The micropattern thus formed on a printing plate is immediately heated until it melts and, at the same time, fixed onto the printing plate. This heating procedure may be replaced by the application of a solvent to thereby dissolve the micropattern-constituting fine powder and fix it onto the printing plate.

The thus formed micropattern, which may be regular or random one, contains about 1 to about 1,000 protuberances (coated portions) per $mm^2$, preferably about 5 to about 500 protuberances per $mm^2$, and these protuberances are from 0.5 to 20$\mu$ in height and from 1 to 200$\mu$ in width (diameter).

The light-sensitive printing plate of the present invention has on its surface a matting layer which shows good adhesiveness to the surface of the printing plate. The matting layer is nearly uneffected by humidity, and, hence, its good adhesiveness is maintained. Accordingly, there is no staining or spoiling of the original film superposed on the light-sensitive printing plate due to the coated powder peeling off. In developed light-sensitive printing plates, portions where the matting layer remains in an image area and portions from which the matting layer has been removed by the development in an image area maintained sufficient affinity for ink. Accordingly, there is no change in printability caused by providing the matting layer.

The present invention will now be described in more detail by the following non-limiting examples of preferred embodiments of the present invention.

EXAMPLE 1

A 0.24 mm thick aluminum plate was soaked in a 7% aqueous solution (solution temperature: 60° C.) of sodium tertiary phosphate for 3 minutes to degrease and, after washing with water, the surface of the plate was rubbed with a nylon brush while applying thereto an aqueous suspension of pumice powder to cause graining. After washing with water, the plate was dipped in a 5% aqueous solution (solution temperature: 70° C.) of JIS #3 sodium silicate ($SiO_2/Na_2O=3.1$ to 3.3 (molar ratio)) for 30 to 60 seconds, then well washed with water and dried.

A solution of the following formulation A was coated on the thus treated aluminum plate and dried to form a light-sensitive layer. Accordingly, a light-sensitive printing plate was obtained. This light-sensitive plate was referred to as Sample (a).

| Formulation A: | |
|---|---|
| 2-Hydroxyethyl methacrylate copolymer (I) (described in Example 1 in U.S. Pat. No. 4,123,276) | 0.87 g |
| 2-Methoxy-4-hydroxy-5-benzoylbenzene-sulfonic acid salt of a condensate of p-diazodiphenylamine with paraformaldehyde | 0.1 g |
| "Oil Blue #603" (blue dye, C.I. 42595, made by Orient Kagaku Kogyo Kabushiki Kaisha) | 0.03 g |
| Methanol | 6 g |
| 2-Methoxyethanol | 6 g |

The dried coating amount of the light-sensitive layer was 1.0 g/m$^2$.

A piece of this light-sensitive printing plate was coated with a 20 wt% aqueous solution of a copolymer of the following formulation B by electrostatic spraying, and exposed to an atmosphere of 60° C. for 5 seconds to dry. Accordingly, the surface of the light-sensitive printing plate was matted. The thus prepared sample was referred to as Sample (b). In absolutely the same manner as with Sample (b) except for using a copolymer of formulation C in place of that of formulation B, there was prepared a light-sensitive printing plate, which was referred to as Sample (c).

TABLE 1

| | Formulation of Copolymer Used | |
|---|---|---|
| Ingredient | Formulation B (mole %) | Formulation C (mole %) |
| Methyl methacrylate | 50 | 50 |
| Ethyl acrylate | 30 | 30 |
| Sodium 2-acrylamido-2-methylpropanesulfonate | 20 | — |
| Sodium acrylate | — | 20 |

In both cases, the copolymers were coated in an amount of 0.1 g/m$^2$ and, as a result of the coating, 50 to 100 liquid droplets were observed per mm$^2$. The height of the dried resin layer was 2 to 6μ, and the width was 20 to 150μ. The time required for vacuum contacting of each of the samples with an original film was measured using a 1,003 mm × 800 mm plate and a 550 mm × 650 mm film.

After imagewise exposure of these samples, they were subjected to the same printing plate-making treatment as described in Example 1 in U.S. Pat. No. 4,123,276 (incorporated herein by reference to disclose such a treatment). When printing was conducted using the thus obtained lithographic printing plates, the results shown in the following table were obtained.

TABLE 2

| Measurement of the Properties of Samples | | | |
|---|---|---|---|
| | Sample | | |
| | (a) | (b) | (c) |
| Vacuum-contacting time (sec.) | 65 | 13 | 13 |
| Time required to develop a plate which was allowed to stand in the atmosphere of 40° C. and 80% RH for 5 days (sec.) | 60 | 60 | Development impossible |

As is shown above, Sample (b) in accordance with the present invention made it possible to conduct vacuum contacting in a remarkably shorter time than that with Sample (a) which was not surface-matted, while causing no detrimental influences on other properties. However, Sample (c) underwent change over time with respect to the properties of the matted portions, thus causing deterioration of developability. This is seemingly attributed to ingredients in the coated portions which adversely affected the light-sensitive layer to change its properties.

EXAMPLE 2

Several pieces of the same light-sensitive printing plate as used in Example 1 for preparing comparative Sample (a) were respectively coated with 20 wt% aqueous solutions of the following formulations D, E and F by air-spraying, and exposed to the atmosphere of 80° C. for 5 seconds to matt the surface of the light-sensitive plate pieces. They were referred to as Samples (d), (e) and (f), respectively.

TABLE 3

| | Formulation of Copolymer | | |
|---|---|---|---|
| Ingredient | Formulation D (mole %) | Formulation E (mole %) | Formulation F (mole %) |
| Methyl methacrylate | 30 | — | — |
| N—t-Butylacrylamide | — | 40 | 50 |
| Methyl acrylate | 40 | 40 | 30 |
| Sodium p-styrene-sulfonate | 30 | 10 | — |
| Sodium 2-acrylamido-2-methyl-propanesulfonate | — | 10 | 15 |
| Sodium vinyl-sulfonate | — | — | 5 |

When individual samples were imagewise exposed, subjected to printing plate-making treatment, and used for printing in the same manner as in Example 1, they all showed a vacuum-contacting time of 13 seconds, and showed good developability and affinitizability with time, thus sufficiently demonstrating the effects of the present invention.

EXAMPLE 3

An aluminum plate was degreased by dipping it in a 20% sodium phosphate aqueous solution and, after electrolytic etching, it was subjected to anodic oxidation in a sulfuric acid solution, then to sealing treatment in a sodium metasilicate aqueous solution.

This aluminum plate was coated with a light-sensitive solution of the following formulation in a dry weight of 2 g/m² to form a light-sensitive layer. Thus, a light-sensitive printing plate was obtained.

| | |
|---|---|
| N—(4-Hydroxyphenyl)methacrylamide/2-hydroxyethyl methacrylate/methyl methacrylate/methacrylic acid (15:30:48:7 molar ratio) copolymer | 5.0 g |
| Hexafluorophosphoric acid salt of a condensate of 4-diazodiphenylamine with formaldehyde | 0.5 g |
| Oxalic acid | 0.05 g |
| Oil Blue #603 | 0.1 g |
| 2-Methoxyethanol | 100 g |

A solution of the following formulation was coated on the light-sensitive layer in a dry weight of 0.05 g/m² by air-spraying.

| | | |
|---|---|---|
| Copolymer | | 100 g |
|   Methyl methacrylate | 50 mole % | |
|   Methyl acrylate | 30 mole % | |
|   2-Acrylamido-2-methylpropanesulfonic acid ammonium salt | 20 mole % | |
| Syloid-162 | | 100 g |
| SiO₂, mean particle diameter: 7μ, made by Fuji Davidson Chemical Co., Ltd. | | |
| Pure water | | 1,000 ml |

This light-sensitive printing plate showed a good vacuum-contacting time, and a lithographic printing plate obtained by treating the light-sensitive printing plate in the same manner as in Example 1 showed excellent properties.

EXAMPLE 4

In absolutely the same manner as with Sample (a) in Example 1 except for changing the formulation of the light-sensitive layer-forming coating solution to the following formulation G, there was prepared a light-sensitive printing plate.

| | |
|---|---|
| Formulation G: | |
| An ester compound between naphthoquinone-1,2-diazido-5-sulfonyl chloride and pyrogallol-acetone resin | 0.9 g |
| Cresol-formaldehyde resin | 2.0 g |
| t-Butylphenol-formaldehyde resin | 0.05 g |
| Naphthoquinone-1,2-diazido-4-sulfonic acid chloride | 0.03 g |
| "Oil Blue #603" | 0.02 g |
| Methyl ethyl ketone | 8 g |
| 2-Methoxyethyl acetate | 15 g |

The dried coating weight of the light-sensitive layer was 1.8 g/m². A coating solution of the following formulation was coated on the light-sensitive printing plate by air-spraying, and dried at 80° C. for 5 seconds.

| | | |
|---|---|---|
| Copolymer | | 200 g |
|   Methyl methacrylate | 50 mole % | |
|   Ethyl acrylate | 25 mole % | |
|   Potassium p-styrenesulfonate | 15 mole % | |
|   Methacrylic acid | 10 mole % | |
| Tartrazine | | 2 g |
| Pure water | | 1,000 ml |

This light-sensitive printing plate showed a good vacuum-contacting time. A lithographic printing plate obtained by imagewise exposing and processing the plate with a developer composed of 100 g of JIS #1 sodium silicate, 50 g of sodium metasilicate, and 1,800 ml of pure water was also excellent.

While the invention has been described in detail and with reference to specific embodiments thereof, it will be apparent to one skilled in the art that various changes and modifications can be made therein without departing from the spirit and scope thereof.

What is claimed is:

1. In a light-sensitive, presensitized printing plate comprising:
   a support base;
   a lithographically suitable light-sensitive layer provided on at least one surface of said support base, said light-sensitive layer comprising a diazo light-sensitive layer; and
   a matting layer consisting essentially of a pattern of coated portions and non-coated portions on said light-sensitive layer;
   the improvement which comprises said coating portions being in the form of a regular or random micropattern resistant against rubbing or pressure formed of a terpolymer having an average molecular weight of 2,000–200,000 comprised of:
   at least one monomer (unit a) selected from the group consisting of p-styrenesulfonic acid, 2-acrylamido-2-methypropanesulfonic acid, ethylenesulfonic acid, and alkali metal salts, ammonium salts, and water-soluble amine salts thereof;
   at least one monomer (unit b) selected from the group consisting of alkyl acrylates having 1 to 10 carbon atoms in the alkyl moiety thereof and alkyl methacrylates having 4 to 10 carbon atoms in the alkyl moiety thereof; and
   at least one monomer (unit c) copolymerizable with said monomer (unit a) and monomer (unit b), wherein said monomer (unit c) as a homopolymer has a glass transition point of 60° C. or more, wherein said terpolymer is comprised of amounts of monomer (unit a), monomer (unit b) and monomer (unit c) in the range of from 5–50 mole %, 10–70 mole % and 20–80 mole %, respectively, wherein monomer (unit c) is selected from monomer units other than monomer (unit a) and monomer (unit b).

2. A light-sensitive printing plate as claimed in claim 1, wherein the copolymer is comprised of amounts of monomer (unit a), monomer (unit b) and monomer (unit c) in the range of 8 to 25 mole%, 15 to 50 mole%, and 40 to 70 mole%, respectively.

3. A light-sensitive printing plate as claimed in claim 1, wherein the micropattern is present in an amount of 1 to 1,000/mm².

4. A light-sensitive printing plate as claimed in claim 3, wherein the micropattern is present in an amount of about 5 to about 5,000/mm² and the micropattern has a height of 0.5 to 20μ and a diameter of about 1 to 200μ.

5. A light-sensitive printing plate as claimed in claim 1, wherein the amount of the light-sensitive layer coated is 0.1 to 5 g/m².

6. A light-sensitive printing plate as claimed in claim 1, wherein the monomer (unit b) is selected from the group consisting of methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, n-butyl methacrylate, isobutyl methacrylate, n-amyl methacrylate, 2-ethylhexyl methacrylate, n-octyl methacrylate, and n-decyl methacrylate.

7. A light-sensitive printing plate as claimed in claim 1, wherein the monomer (unit c) is selected from the group consisting of styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene, p-cyanostyrene, acrylonitrile, methacrylonitrile, methyl methacrylate, ethyl methacrylate, acrylamide, N-sec-butylacrylamide, N-tert-butylacrylamide, N,N-dibutylacrylamide, and N-tert-butylmethacrylamide.

8. A light-sensitive presensitized printing plate as claimed in claim 1, wherein said micropattern is provided by coating a solution containing said terpolymer in the form of an aqueous solvent system and then drying the coating.

* * * * *